United States Patent [19]
Bertin et al.

[11] Patent Number: 5,870,350
[45] Date of Patent: Feb. 9, 1999

[54] HIGH PERFORMANCE, HIGH BANDWIDTH MEMORY BUS ARCHITECTURE UTILIZING SDRAMS

[75] Inventors: Claude L. Bertin, South Burlington; Erik L. Hedberg, Essex Junction, both of Vt.

[73] Assignee: International Business Machines Corporation, Armonk, N.Y.

[21] Appl. No.: 861,101

[22] Filed: May 21, 1997

[51] Int. Cl.[6] .................................................. G11C 8/00
[52] U.S. Cl. ............... 365/233; 365/230.02; 365/230.03; 365/189.02; 365/221
[58] Field of Search .............................. 365/233, 230.02, 365/230.03, 189.02, 230.01, 221

[56] References Cited

U.S. PATENT DOCUMENTS

| | | |
|---|---|---|
| 4,884,237 | 11/1989 | Mueller et al. . |
| 5,226,168 | 7/1993 | Kobayashi et al. . |
| 5,276,843 | 1/1994 | Tillinghast et al. . |
| 5,291,584 | 3/1994 | Challa et al. . |
| 5,410,680 | 4/1995 | Challa et al. . |
| 5,430,676 | 7/1995 | Ware et al. . |
| 5,434,817 | 7/1995 | Ware et al. . |
| 5,511,024 | 4/1996 | Ware et al. . |
| 5,604,713 | 2/1997 | Short et al. ......................... 365/233 X |
| 5,666,321 | 9/1997 | Schaefer .............................. 365/233 X |
| 5,691,955 | 11/1997 | Yamauchi ....................... 365/230.03 X |

*Primary Examiner*—Huan Hoang
*Attorney, Agent, or Firm*—Whitham, Curtis & Whitham; Robert A. Walsh

[57] ABSTRACT

A high performance, high bandwidth memory bus architecture and module. The module may be a card that includes standard synchronous DRAM (SDRAM) chips and reduces latency and pin count. Four bus pins separate input commands from data and establish parallel system operations. By maintaining "packet" type transactions, independent memory operations can be enhanced from that of normal SDRAM operations. The architecture divides its buses into command and data inputs that are separate from output data.

12 Claims, 4 Drawing Sheets

HIGH PERFORMANCE, HIGH BANDWIDTH MEMORY BUS ARCHITECTURE UTILIZING SDRAMS

BACKGROUND OF THE INVENTION

1. Field of the Invention

The present invention generally relates to Random Access Memory (RAM) bus architectures and, more particularly, to a RAM bus architecture that utilizes standard Synchronous Dynamic RAMs (SDRAMs) and that is capable of high bandwidth, high speed data transfer while minimizing Input/Output (I/O) pin count.

2. Background Description

High bandwidth architectures have been proposed for Dynamic Random Access Memories (DRAMs) that reduce chip pin count to nine pins by multiplexing input commands, addresses and data. For example, see U.S. Pat. No. 5,430,676 to Ware et al., entitled "Dynamic Random Access Memory System," U.S. Pat. No. 5,434,817 to Ware et al., entitled "Dynamic Random Access Memory System," and U.S. Pat. No. 5,511,024 to Ware et al., entitled "Dynamic Random Access Memory System."

In these high bandwidth DRAM architectures, commands are serially input on the nine pins at a 553 MHZ clock rate. Packets of control information called "Request Packets" are transferred to and stored in the DRAM during what is termed a transaction operation. After a pre-specified latency period, data is either input or output at a 500 MHZ transfer rate.

Request packets include a device, bank, and row address of a page to be activated; the column address of the first of eight bytes (an octo-byte) to be read; and, a Data packet. A Data packet includes input data and data masking commands.

Bus switching rates during these command or data transactions place stringent requirements on system bus net. Since all system communication and handshaking with the DRAM is through the nine bit bus, parallel system operations become difficult. Although the high bandwidth architecture may provide a faster data transfer rate than other high bandwidth RAM alternatives, bus contentions and bus blocking may result to reduce overall system performance and prevent seamless data transfers.

SUMMARY OF THE INVENTION

It is therefore an object of the invention to provide a high performance, high bandwidth RAM bus architecture that uses standard synchronous DRAM (SDRAM) chips and reduces latency.

It is another object of the invention to provide an interface protocol that minimizes I/O pin count, while providing high bandwidth, high performance and seamless data using standard SDRAM chips.

According to the invention, input commands are separate from data. Thus, the architecture of the present invention is adapted for parallel system and seamless data operations, while maintaining "packet" type transactions. Independent memory operations are enhanced over that of normal SDRAM operations.

The RAM architecture according to the invention includes separate command/address inputs, data inputs and data outputs similar to state of the art Random Access Memory (RAM) bus architectures. However, to minimize signal and I/O count, the architecture of the present invention maintains a "packet" instruction set to avoid bus contention that could otherwise impact system performance.

This interface logic can be in an Application Specific Integrated Circuit (ASIC) chip placed in close electrical proximity to the SDRAM chips or, alternatively, included in a processor or controller.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
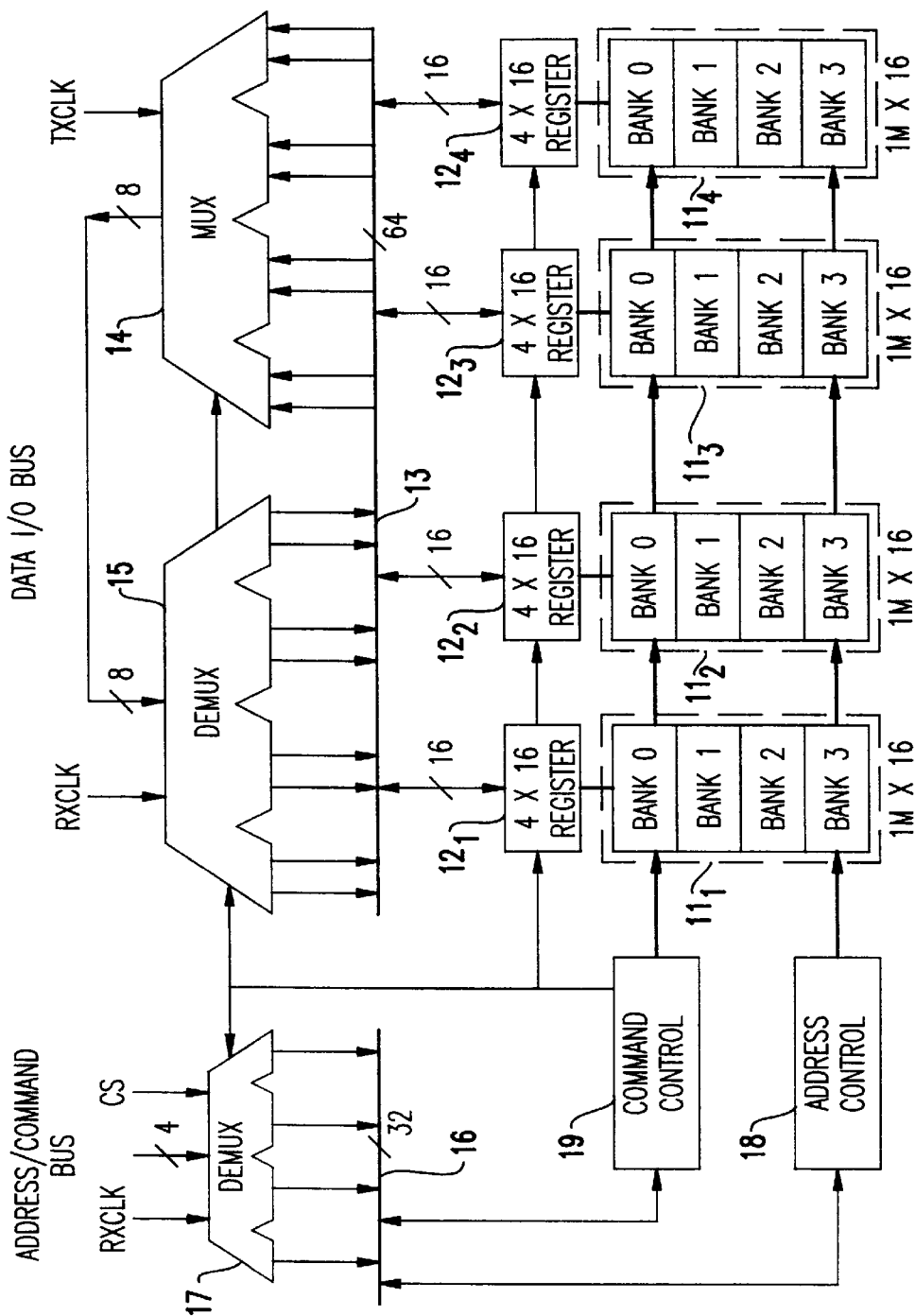
FIG. 1 is a block diagram of 4 SDRAMs being controlled by a preferred embodiment high bandwidth interface/controller.

Referring now to the drawings, and more particularly to FIG. 1, there is shown a memory module that may be a card level implementation of the present invention bus architecture. The module may be constructed, for example, from four standard SDRAM chips and an Application Specific Integrated Circuit (ASIC) that includes, other than the SDRAM chips, all of the logic and registers of FIG. 1. Alternately, the module may be a single chip with all function of the module, ASIC and SDRAMs, implemented therein.

Figure 2:
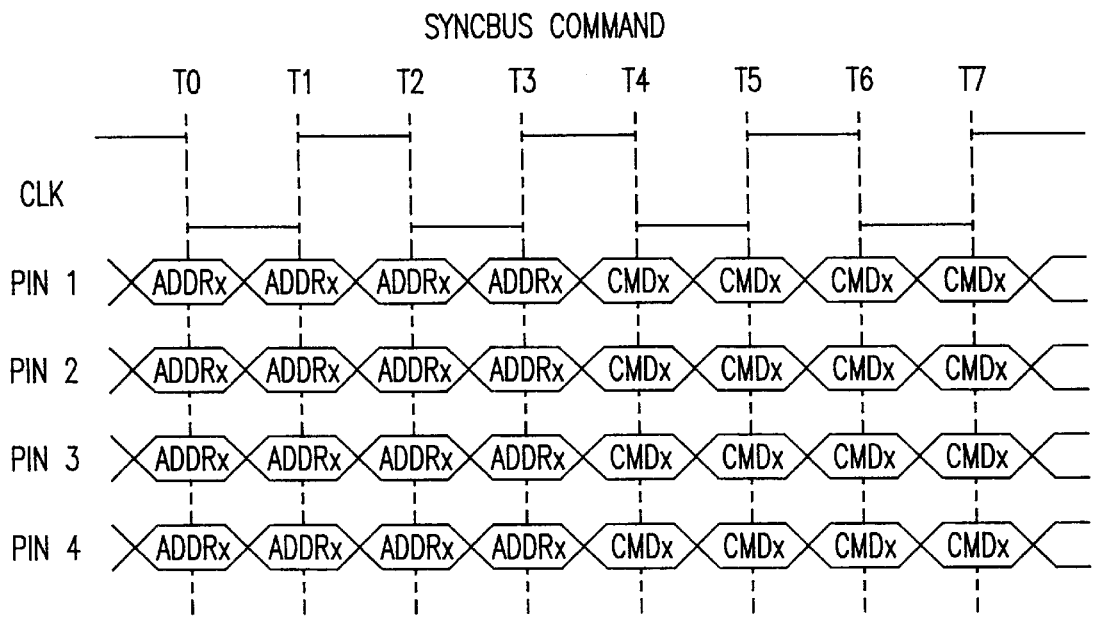
FIG. 2 is a timing diagram illustrating receiving a command/address packet for the preferred embodiment of FIG. 1.

FIG. 2 illustrates an address/command transfer to the four control pins with respect to system clocking. Request packets are passed to the Address/Command Inputs and Data I/O via high speed bus network (typically 500 MHZ). Chip transfers are triggered both by the rising and falling edges of the input clocks (RXCLK, TXCLK) and CS.

Figure 4A:
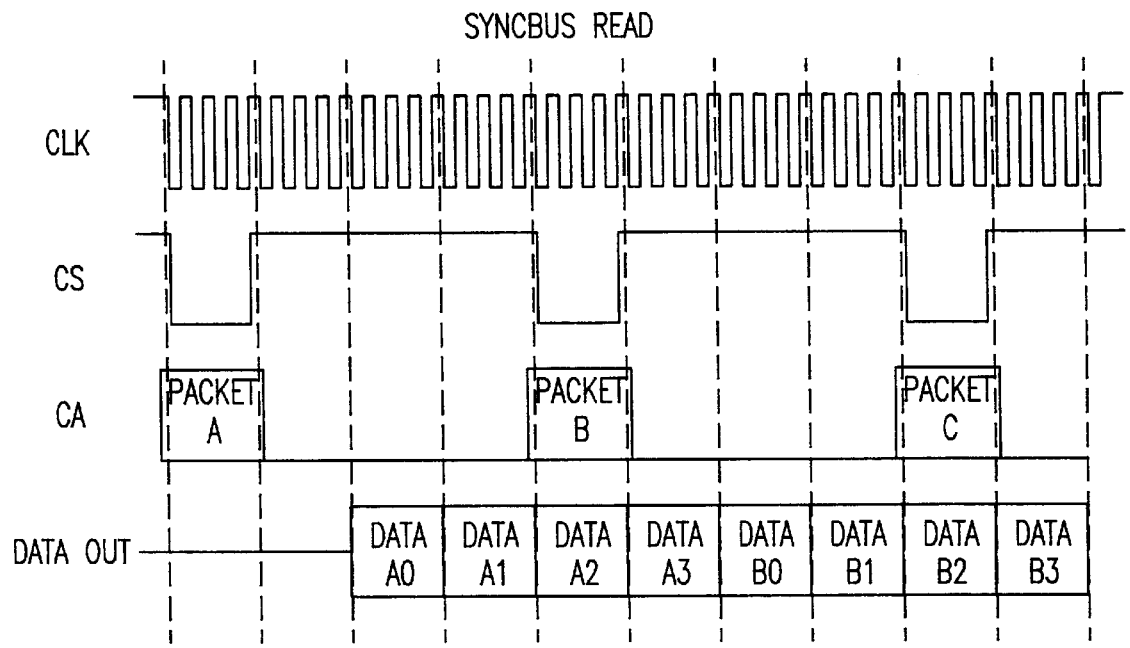
FIGS. 4A–B are packet transfer timing diagrams for the preferred embodiment of FIG. 1.

In the example illustrated in FIG. 1, a 64 megabit (Mb) RAM module 10 includes four 16 Mb SDRAMs $11_1$ to $11_4$. Each of the four 16Mb SDRAMs $11_1$ to $11_4$ has four banks. According to the present invention, page depth and data bandwidth is maintained, comparable to that of other high bandwidth architectures, by activating one bank in each of four SDRAMs in parallel in a burst-of-four operation. In FIG. 4A, during a Read operation, Command Control 19 and Address Control 18 select data from Bank 0, for example, on all four SDRAMs $11_1$ to $11_4$ which is passed to the 4×16 registers $12_1$ to $12_4$, respectively.

Once the data is loaded, two bytes at a time are passed from each register $12_1$–$12_4$ onto a 64-bit bus 13. A multiplexer 14 synchronously selects each byte as one of eight blocks from the 64 bit bus 13. The eight blocks are clocked sequentially to the Data I/O Bus. Data is pipelined so that, in parallel with transferring data from register $12_1$–$12_4$ across the 64-bit bus 13 to the multiplexer 14, the next block of data can be read from the SDRAMs $11_1$–$11_4$ and passed to the inputs of registers $12_1$–$12_4$. This next block is, in turn, stored and then, passed out in a first in, first out (FIFO) type manner.

Commands and addresses are loaded sequentially during a Request Packet Command. Commands are demultiplexed onto a 32-bit bus to produce a parallel instruction format for the Address Control 18 and Control Logic 19. The Control Logic 19 controls a conventional (Jedec standard) SDRAM for parallel operation.

Figure 3:
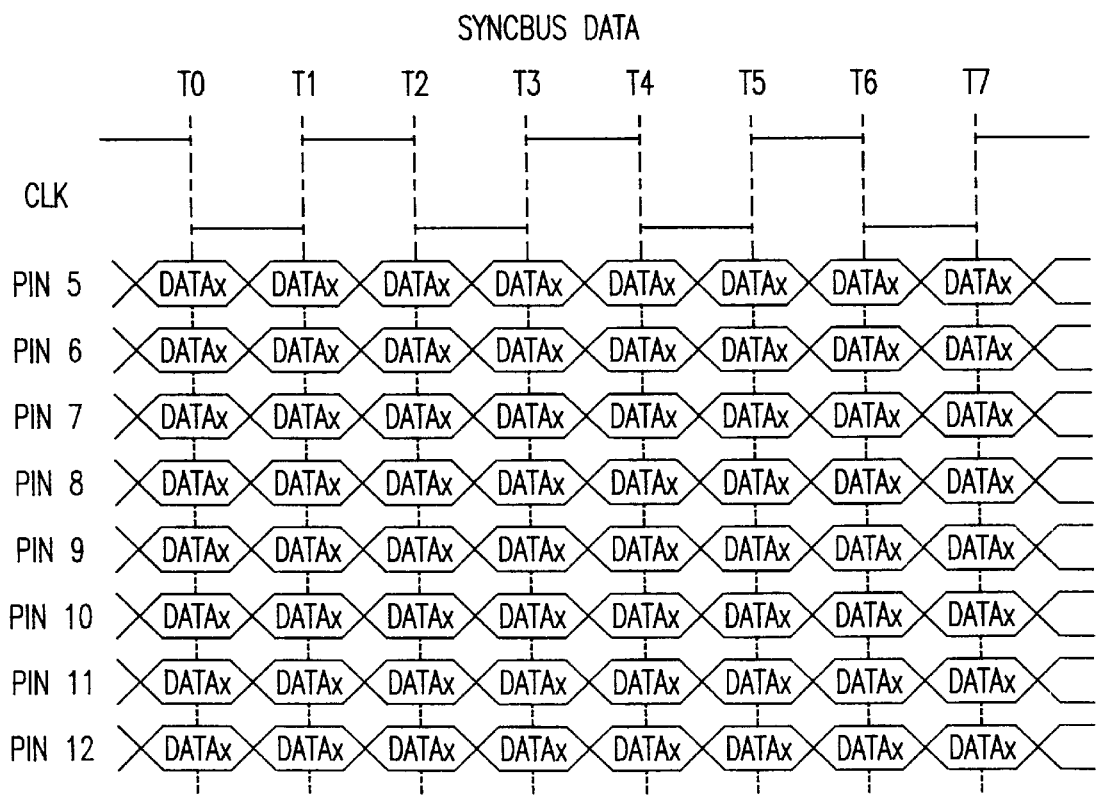
FIG. 3 is a timing diagram illustrating receiving a data packet for the preferred embodiment of FIG. 1.
Figure 4B:
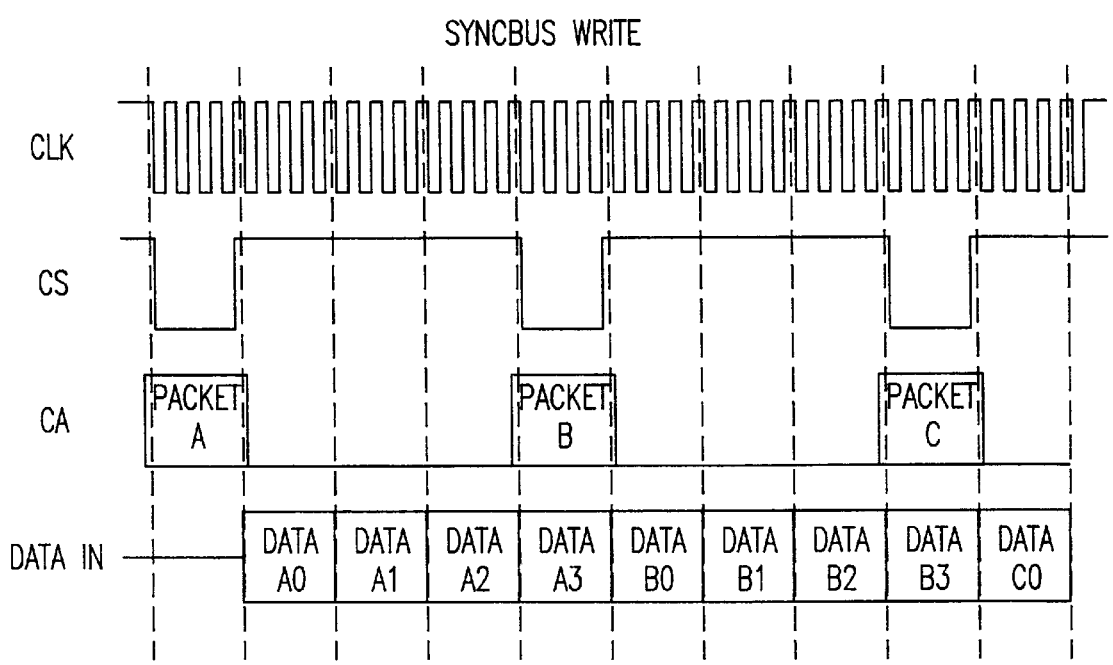

FIG. 3 is a timing diagram of a typical data Input/Output (I/O) packet sequence for Command Control 19 as in FIG. 2. In FIG. 4B, during a write operation, high speed clocks sequentially pass bytes of data to the 64-bit bus 13 through demultiplexer 15 in parallel with sequentially loading address and command control information onto a 32-bit bus 16 through demultiplexer 17. Starting addresses and commands from the 32 bit bus 16 are stored in the Address Controller 18 and the Command Controller 19, which maintain compliance with SDRAM handshaking protocol.

Command Control 19 decodes and issues commands to the registers $12_1$ to $12_4$, multiplexer 14, demultiplexers 15, 17 and SDRAMs $11_1$ to $11_4$. The command controller 19 also steers data between the Data I/O Bus and the 64-bit bus 13 through demultiplexer 15.

A Chip Select (CS) signal enables the command demultiplexer 17 and initiates loading commands onto the 32-bit bus 16. Once loaded from the 32-bit bus 16, controllers 18 and 19 independently select and access selected locations in the SDRAMs $11_1$ to $11_4$ to transfer thirty-two bytes of data (eight bytes from each SDRAM $11_1$ to $11_4$). The 32-bit address/command bus 16 includes sixteen address bits and sixteen command bits.

Commands can include, but are not limited to:
1) Mode Register Set
2) Bank Active
3) Bank Precharge
4) Read
5) Read with Auto precharge
6) Write
7) Write with Auto precharge
8) Bank Activate/Read
9) Bank Activate/Write
10) Precharge/Bank Activate/Read
11) Precharge/Bank Activate/Write
12) Auto-Refresh
13) Self-Refresh
14) Power Down
15) Power Up
16) Data Masking The bus architecture of the preferred embodiment may be a single chip or may be on a card and include standard SDRAM chips with an ASIC for multiplexing, providing future SDRAM generation performance with present day parts. Alternatively, all logic functions in the preferred embodiment, such as the multiplexers, controls, and registers could be integrated onto a standard processor for high speed memory handling. Standard SDRAMs may be located electrically near this integrated processor for very high data and low latency access rates.

Figure 5:
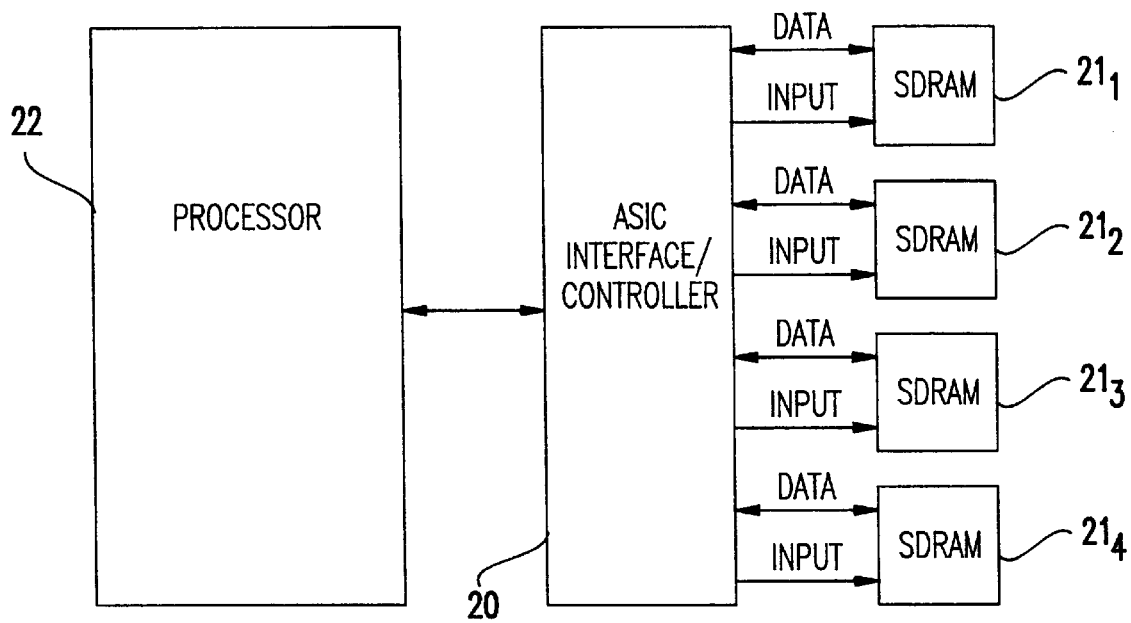
FIG. 5 is a system block diagram of a first preferred embodiment RAM bus architecture according to the present invention.

FIG. 5 is a system block diagram of a first preferred embodiment SYNCBUS architecture according to the present invention. In the first preferred embodiment system of FIG. 5 an ASIC 20 couples four individual SDRAM chips $21_1$ to $21_4$ to processor 22. Thus, ASIC 20 includes all of the logic of FIG. 1, with SDRAMs $21_1$ to $21_4$ corresponding to SDRAMs $11_1$ to $11_4$. ASIC 20 and SDRAMs $11_1$ to $11_4$ may be on a system board, an individual card or module.

Figure 6:
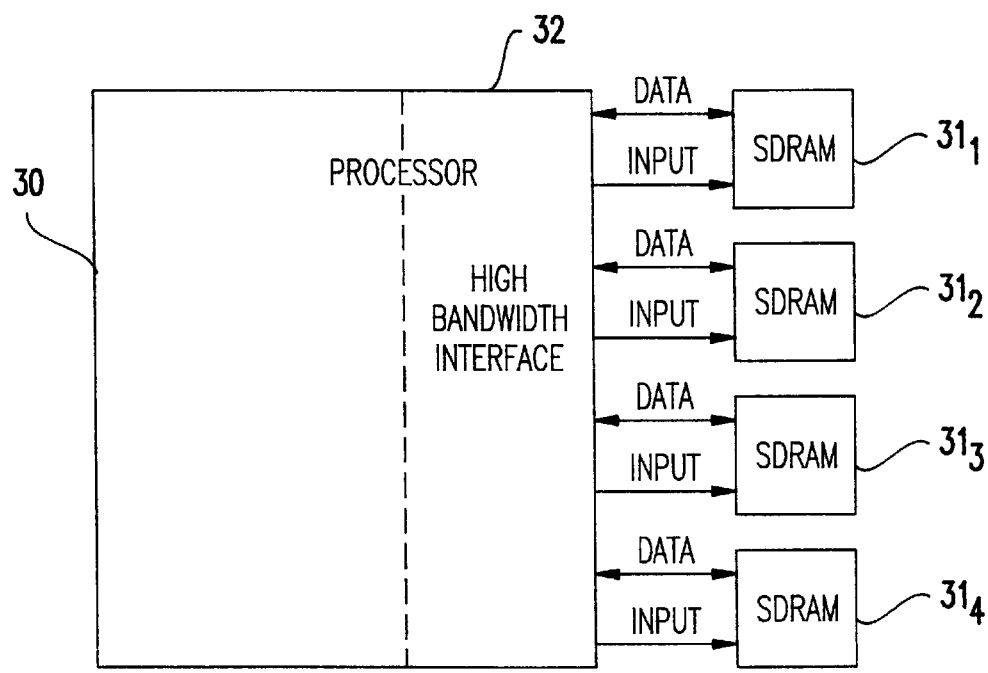
FIG. 6 is a system block diagram of a second preferred embodiment RAM bus architecture according to the present invention.

FIG. 6 is a system block diagram of a second preferred embodiment RAM bus architecture according to the present invention. In the second preferred embodiment system of FIG. 6 Processor 30 is coupled directly to SDRAMs $31_1$ to $31_4$ through a High Bandwidth Interface 32, which is integral to the microprocessor 30. The High Bandwidth Interface 32 includes substantially the same function as that provided by ASIC 20 in FIG. 5.

In summary, the bus architecture of the present invention is an improved high bandwidth RAM architecture that may be implemented using standard SDRAM chips. The command bus is separate from the data bus in the present invention, while I/O pin count is minimized to enable parallel system operation. Due to this separation of the address/command bus from the Data I/O bus of the present invention, instruction execution may initiate a memory access before the entire packet is completely loaded to minimize access latency. By contrast, prior art high bandwidth architectures require that instruction packets be completely loaded before beginning a memory access. Thus, the present invention provides high frequency, seamless data transfers of multiple pages with latency minimized.

While the invention has been described in terms of a single preferred embodiment, those skilled in the art will recognize that the invention can be practiced with modification within the spirit and scope of the invention. It is intended that the appended claims include all such variations and modifications that fall within the spirit and scope of the invention.

Having thus described our invention, what we claim as new and desire to secure by Letters Patent is as follows:

1. A high performance, high bandwidth memory comprising:
    a plurality of multiple bank synchronous dynamic random access memories (SDRAMs);
    a plurality of registers, each of said plurality of registers being coupled between a corresponding one of said multiple bank SDRAMs and a first memory bus, data being transferred between each of said plurality of registers and said corresponding SDRAMs;
    a multiplexer coupling said first memory bus to a data input/output (I/O) bus, such that data is transferred from the registers through said multiplexer to said I/O bus during a read operation;
    a first demultiplexer coupling said I/O bus to said first memory bus, such that data is transferred from the I/O bus through said first demultiplexer to the registers during a write operation;
    a second demultiplexer coupling an address/command bus to a second memory bus and, the second memory bus having a width smaller than the first memory bus, addresses and commands being transferred to the second memory bus through the second demultiplexer from the address/command bus during a read or a write operation;
    an address controller connected to said second memory bus, said address controller receiving and storing addresses from said second memory bus; and
    a command controller connected to said second memory bus, said command controller receiving and storing commands from said second memory bus, the address controller and the command controller independently activating the SDRAMs to input or output data.

2. The high performance, high bandwidth memory of claim 1 wherein the address controller and the command controller begin activating the SDRAMs prior to receiving and storing complete said addresses and commands.

3. The high performance, high bandwidth memory of claim 1 wherein said memory is in a single integrated circuit chip.

4. The high performance, high bandwidth memory of claim 1 wherein the multiplexer, first demultiplexer, second demultiplexer, address controller and command controller are included in a processor and said SDRAMs are SDRAM chips in close proximity to said processor.

5. The high performance, high bandwidth memory of claim 4 wherein the plurality of registers are included in said processor.

6. The high performance, high bandwidth memory of claim 1 further wherein the second demultiplexer includes an enable, the enable initiating passing the received address and command control information to the second memory bus.

7. A high performance, high bandwidth memory system, wherein the high performance, high bandwidth memory of claim 6 is a memory module, said high performance, high bandwidth memory system comprising a plurality of said memory modules independently selected by said enable.

8. The high performance memory system of claim 7 wherein each said memory module is high performance, high bandwidth memory chip.

9. The high performance memory system of claim 7 wherein each said memory module is high performance, high bandwidth memory card.

10. A high performance, high bandwidth memory bus architecture comprising:

a plurality of multiple bank synchronous dynamic random access memories (SDRAMs);

a plurality of registers, one for each of said multiple bank SDRAMs, for receiving data read out of the SDRAMs or data to be written into the SDRAMs;

a first memory bus connected to said plurality of registers and receiving data read out of the registers or inputting data to the registers;

a first multiplexer connected to a data input/output (I/O) bus, the first multiplexer multiplexing data on the first memory bus down to a predetermined number of bits and clocking those bits to the I/O bus, such that while data is being transferred across the first memory bus between the registers and the first multiplexer, more data may be read from the SDRAMs to the registers in a first in, first out (FIFO) type manner;

a demultiplexer receiving data from the I/O bus during a write operation and responsive to high speed clocks, placing said received data on the first memory bus with data;

a second memory bus having a width smaller than the first memory bus;

a second demultiplexer connected to the second memory bus and receiving address and command control information from a address/command bus and passing the received address and command control information to the second memory bus; and an address controller and a command controller connected to the second memory bus, starting addresses and commands being stored in the address controller and the command controller to maintain proper SDRAM handshaking and, once loaded, the address controller and the command controller independently activating the SDRAMs to input or output data.

11. The high performance, high bandwidth memory bus architecture of claim 10 further including an enable for enabling the second demultiplexer, the enable initiating passing the received address and command control information to the second memory bus.

12. The high performance, high bandwidth memory bus architecture of claim 10 wherein the address controller and the command controller begin activating the SDRAMs before storing said address and commands is complete.

* * * * *